United States Patent [19]

Suzawa et al.

[11] Patent Number: 5,728,259
[45] Date of Patent: Mar. 17, 1998

[54] PROCESS FOR FABRICATING THIN-FILM SEMICONDUCTOR DEVICE WITHOUT PLASMA INDUCED DAMAGE

[75] Inventors: Hideomi Suzawa, Kanagawa; Shunpei Yamazaki, Tokyo; Toshiji Hamatani; Yasuhiko Takemura, both of Kanagawa, all of Japan

[73] Assignee: Semiconductor Energy Laboratory, Ltd., Japan

[21] Appl. No.: 545,122

[22] Filed: Oct. 19, 1995

[30] Foreign Application Priority Data

Oct. 26, 1994 [JP] Japan .................. 6-287383

[51] Int. Cl.$^6$ ................................ H01L 21/306
[52] U.S. Cl. .................. 156/646.1; 156/662.1; 437/228; 437/947; 437/981
[58] Field of Search ............ 156/646.1, 662.1, 156/659.11; 437/228, 233, 247, 947, 981

[56] References Cited

U.S. PATENT DOCUMENTS

| | | | |
|---|---|---|---|
| 3,936,331 | 2/1976 | Luce et al. | 437/981 |
| 4,056,414 | 11/1977 | Kopp | 437/239 |
| 4,937,808 | 6/1990 | Shimada et al. | 369/112 |
| 5,326,406 | 7/1994 | Kaneko et al. | 134/1 |
| 5,393,682 | 2/1995 | Liu | 437/981 |
| 5,406,109 | 4/1995 | Whitney | 257/467 |
| 5,489,542 | 2/1996 | Iwai et al. | 437/241 |
| 5,545,571 | 8/1996 | Yamazaki et al. | 437/170 |

FOREIGN PATENT DOCUMENTS

04-32556  2/1992  Japan .
04-186784 7/1992  Japan .

Primary Examiner—R. Bruce Breneman
Assistant Examiner—Anita Alanko
Attorney, Agent, or Firm—Edward D. Manzo; Mark J. Murphy

[57] ABSTRACT

Disclosed herein is a process for fabricating a thin-film semiconductor device which includes (1) a step of etching a silicon film by wet etching or gas etching, the former employing a liquid containing hydrazine or ethylene diamine, the latter employing chlorine fluoride, thereby forming an island-like silicon semiconductor region having inclined edges, and (2) a step of forming thereon a gate insulating film by plasma-free process such as heated CVD. The process yields the island-like silicon region and gate insulating film completely free from plasma-induced damage. This reduces the leakage current between the source and drain (which is due to plasma-induced damage) and prevents the degradation of characteristic properties.

27 Claims, 4 Drawing Sheets

PROCESS FOR FABRICATING THIN-FILM SEMICONDUCTOR DEVICE WITHOUT PLASMA INDUCED DAMAGE

BACKGROUND OF THE INVENTION

1. Field of the Invention

The present invention relates to a process for producing elements for thin-film integrated circuits, such as thin-film transistors (TFT). According to the present invention, the thin-film transistor may be formed on either an insulating substrate, such as glass, or a semiconductor substrate, such as single-crystalline silicon, and it is used for the active matrix circuit of liquid crystal displays or the drive circuit of image sensors.

2. Description of the Related Art

There has recently arisen a demand for a thin-film transistor to be formed at temperatures below 750° C. A thin-film transistor has the gate insulating film and gate electrode formed from a silicon semiconductor film which is formed on an insulating film (such as silicon oxide and silicon nitride) by etching to form an island-like silicon region (active layer). At such low temperatures, however, it is impossible to form the gate insulating film by the thermal oxidation method which has been employed in the conventional technology for semiconductor integrated circuits. Therefore, the only technique to form the insulating film has been by chemical vapor deposition (CVD method) or physical vapor deposition (PVD method). It has been the common practice to use plasma for the CVD and PVD methods. (Such a process is referred to as plasma CVD or sputtering.)

The CVD and PVD methods have a disadvantage of forming an insulating film with poor step coverage, which adversely affects the reliability, yields, and characteristic properties. The poor step coverage manifests itself on the gate insulating film having nearly vertical edges. There even exists an instance where the film on the vertical edge is only half as thick as that on the horizontal surface.

The island-like silicon region is conventionally obtained by the dry-etching of silicon film. This dry etching is usually reactive ion etching which is employed by necessity to improve the etching selectivity for silicon and the underlying silicon oxide or silicon nitride. The reactive ion etching usually gives rise to a vertical etched surface but sometimes an inclined etched surface, depending on the etching conditions. In the latter case, there have been proposed several means to address the problem with poor step coverage.

Figures 4A, 4B, 4C:
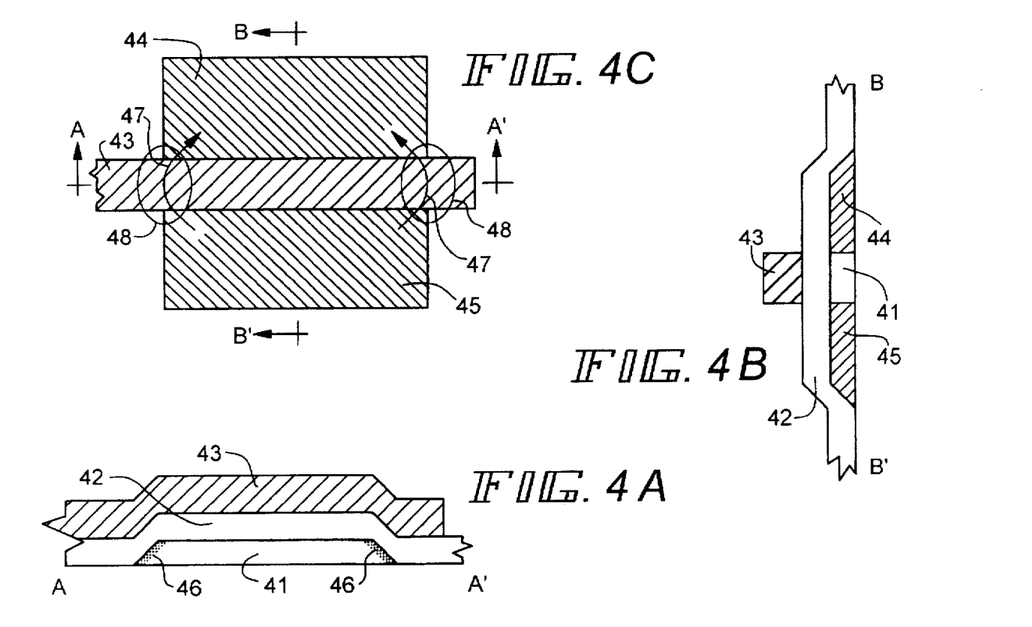
FIG. 4 is a top view of a conventional TFT and sectional views taken along A—A' and B—B' in the top view.

FIG. 4 illustrates a top view of a typical TFT having inclined edges with sectional views taken along lines A–A' and B–B'. The TFT formed on the substrate has thin-film silicon semiconductor regions 44, 45 (source and drain regions of p-type or n-type conductivity) which are under the gate electrode 43 and are separated by the substantially intrinsic channel forming region 41. These silicon semiconductor regions are covered with a gate insulating film 42, which is further covered with an interlayer insulator 49 on which is formed interconnects (not shown). These interconnects are connected to the impurity regions 44, 45 through contact holes formed in the interlayer insulator 49.

It is apparent from FIG. 4 that the inclined edge of the silicon semiconductor region permits the gate insulating film 42 to be almost equally thick on both the edge and the horizontal part. This contributes to the improvement of withstand voltage at the edge. This, in turn, contributes to the characteristics and yields of TFT.

It turned out, however, that the above-mentioned countermeasure does not solve the problem fundamentally. Surely, the inclined edge of the silicon semiconductor region reduces the possibility of interconnects being broken. Nevertheless, there still exist many problems that remain unsolved. The most serious problem is leakage current between the source and the drain. Even though a prescribed drain voltage is applied across the source and the drain, no channel is formed between them if the potential of the gate electrode is equal to that of the source. It follows, therefore, that substantially no current will flow between the source and the drain. In other words, the off-state current should theoretically be less than 0.1 pA.

In actuality, however, there is a leakage current (off-state current) greater than 10 pA. Strangely, it turned out that the off-state current is approximately the same regardless of the channel width of TFT. Such off-state current is fatal to the switching transistor for the active matrix circuit. Therefore, it is necessary that the off-state current be less than 10 pA, preferably less than 2 pA.

The present inventors investigated the cause of off-state current. As the result, two important points were found. The first point is that current 47 flows through the edge 48 of the silicon region in the substantially intrinsic channel forming region 41. The second point is the leakage current along the surface of the silicon film. As compared with the first point, the second point has less contribution to the off-state current. Nevertheless, it was found that it is a major cause of the deterioration of characteristic properties.

It turned out that the first point results from the damage to the edge by excessive plasma in the process of dry-etching the silicon film, thereby forming the island-like silicon region. It also turned out that the second point results from the damage to the silicon film by plasma in the process of forming the gate insulating film by plasma CVD or sputtering.

Physical and electrical measurements revealed that the process of forming film by dry-etching or plasma causes damage 46 to the edge 48 and the silicon surface. This damage gives rise to dangling bonds in silicon and oxidizes the silicon surface to a low degree, thereby forming an incomplete silicon oxide film having poor characteristic properties. Dangling bonds and incomplete silicon oxide film impair the characteristic properties of a semiconductor, causing the semiconductor to function like a conductor. It turned out that damage by plasma is not peculiar to the inclined edge alone but is common to the island-like silicon regions formed by dry-etching.

The off-state current due to the damaged edge is nearly invariable regardless of the channel width because the damaged part 46 has almost the same sectional area regardless of the channel width. Consequently, in order to reduce the off-state current, it is necessary to remove the damaged part 46, or it is necessary to employ a new etching method which causes no plasma damage.

The present invention was completed to address the above-mentioned problems. Accordingly, it is an object of the present invention to provide a process for forming an island-like silicon region which has inclined edges and is immune to plasma damage.

THE SUMMARY OF THE INVENTION

The object of the present invention is achieved by forming an island-like silicon region without using plasma and then forming the gate insulating film by the plasma-free CVD method (such as a heated CVD method). The first step is accomplished by etching a silicon film by wet etching or gas etching, the former employing hydrazine or ethylenediamine as the wet etchant; the latter employing chlorine fluoride (or any other gas) in a unionized state capable of etching silicon.

The present invention includes at least steps (1) and (2) or steps (2) and (3) defined below: (1) a step of selectively forming a mask on a silicon film (100–1000 Å thick) formed on an insulating surface; (2) a step of etching the silicon film using the mask by the aid of a liquid or gas capable of etching silicon, thereby forming an island-like silicon semiconductor region and (3) a step of covering the silicon semiconductor region by plasma-free chemical vapor deposition, thereby forming a gate insulating film.

If the step (2) employs wet etching with a liquid containing the $NH_2$ group, it is desirable to mix it with a proper amount of water in combination with any of propanol, butanol, isopropanol ($CH_3CHOHCH_3$), and pyrocatechol ($C_6H_4(OH)_2$).

If the step (2) employs gas etching, it is desirable to use any of chlorine monofluoride (ClF), chlorine trifluoride ($ClF_3$), and chlorine pentafluoride ($ClF_5$) which exhibit an extremely strong fluorinating action. These gases fluorinate silicon to form gaseous silicon fluoride compounds, thereby accomplishing etching. Of these gases, chlorine trifluoride is the most chemically stable (and hence is easy to store). Being unreactive to silicon oxide, chlorine trifluoride permits one to use silicon oxide as a mask.

In the above-mentioned step (1), the mask film may be formed from a photoresist, silicon oxide, silicon nitride, or silicon oxide nitride. The mask film of an organic photoresist is attacked by hydrazine but withstands chlorine trifluoride. Strictly speaking, the photoresist is subject to etching by chlorine trifluoride, but it functions as a mask satisfactorily because it is etched at the same rate as silicon. This property can be subtly utilized so that the photoresist film retreats at the same rate as the silicon film edge. This results in the inclined edge.

In the case where the above-mentioned step (1) resorts to hydrazine as the etchant, etching should be carried out in the following manner. First, silicon is coated with a layer (10–200 Å thick, preferably 30–200 Å thick) composed mainly of silicon oxide, silicon nitride, or silicon oxide nitride. This layer is entirely coated with a photoresist, and a resist mask is formed by the known photolithography method. Using this resist mask, the underlying layer of silicon oxide, silicon nitride, or silicon oxide nitride is etched. The thus formed layer is used as a mask.

An advantage of this step is that the photoresist does not come into direct contact with the silicon film. Therefore, this step is desirable for etching with chlorine fluoride instead of hydrazine. The layer composed mainly of silicon oxide, silicon nitride, or silicon oxide nitride may be formed by a plasma-free process, such as heated CVD method and thermal oxidation method. In the case where plasma CVD method or sputtering method is employed, plasma-induced damage can be recovered if the etching step is followed by heating above 450° C., preferably above 550° C.

After the etching of the layer composed mainly of silicon oxide, silicon nitride, or silicon oxide nitride, the resist mask is not necessary any longer. Nevertheless, it is desirable to carry out satisfactory etching while leaving the photoresist mask in position. The reason for this is that the silicon surface is slightly oxidized when the photoresist is removed and the oxidized surface adversely affects etching if the etching rate greatly varies for silicon and silicon oxide as in the present invention. This holds true even in the case of organic photoresist which is severely damaged by hydrazine.

In the above-mentioned step (3), the gate insulating film would have good characteristics if it is formed by heated CVD that employs as feed gases silane and oxygen or nitrogen oxide (nitrogen dioxide, nitrogen monoxide, dinitrogen monoxide). It would have better characteristics if it is annealed afterward at 450°–600° C. in an atmosphere of dinitrogen monoxide.

The step (1) should be carried out such that the resulting silicon film has a thickness in the range of 100 to 1000 Å. This condition is necessary so that the section of the edge has a sufficiently gentle slope. If the silicon film is thicker than 1000 Å, the section of the edge would be nearly vertical, and hence it is impossible to obtain the island-like silicon region intended in the present invention. However, the above-mentioned restriction on thickness is not necessary under adequate conditions that permit the ideally inclined edge to be obtained as demonstrated in the example that follows.

Plasma-induced damage does not occur in the case of wet etching and gas etching (both as in step (2) mentioned above), the latter employing an unionized gas, and plasma-free CVD. As is well known, wet etching is isotropic etching, and the results of the present inventors' investigation suggest that gas etching is also isotropic etching. Therefore, either wet etching or gas etching provides an extremely smooth cross section of etching if the silicon film is the same in thickness. The consequence is that the gate electrode is immune to breaking and the off-state current sufficiently decreases. In order to improve the step coverage, thereby increasing yields, it is necessary that the gate insulating film to be formed on the island-like silicon region be 2–10 times as thick as the silicon film.

DETAILED DESCRIPTION OF THE PREFERRED EMBODIMENTS

EXAMPLE 1

The fabrication steps in this example are shown in FIGS. 1(A)–1(D).

Figure 1A:
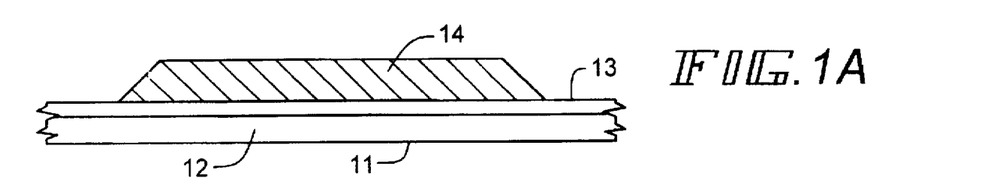
FIGS. 1(A) to 1(D) are sectional views showing the fabrication process in Example 1.

First, a glass substrate (Corning #7059) is coated by sputtering with a silicon oxide film (1000–5000 Å, say 2000 Å thick) as an underlying film 11. On the underlying film 11 is formed from monosilane ($SiH_4$) by plasma CVD an amorphous silicon film 12 (300–1500 Å, say 1000 Å thick). On this silicon film is formed by sputtering a silicon oxide film 13 (100–500 Å, say 200 Å thick).

The substrate is heat-annealed at 550°–600° C. for 4–48 hours in an atmosphere of nitrogen so that the silicon film 12 is crystallized. For accelerated crystallization in this step the silicon film 12 may be incorporated with a trace amount of a metal element (such as nickel, palladium, cobalt, iron, and platinum) which promotes the crystallization of amorphous silicon. Alternatively, crystallization by heat annealing may be followed by irradiation with laser light or similar high-intensity light which improves the crystalline properties. Then, a photoresist mask 14 is formed by the known photolithography. (FIG. 1(A))

Figure 1B:
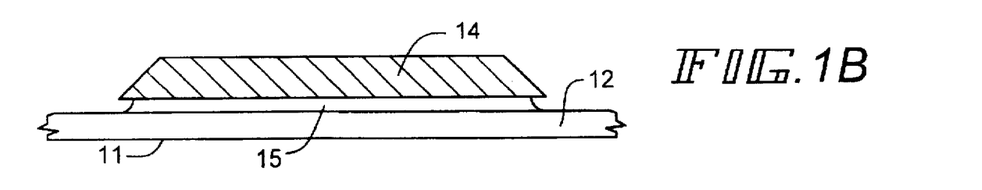

With this photoresist mask 14, the silicon oxide film 13 is etched by wet etching which employs as an etchant buffered hydrofluoric acid (a mixed solution of hydrofluoric acid and ammonium fluoride in a ratio of 1:10). (This mixed solution is referred to as 1/10 BHF hereinafter.) The ratio is not restrictive. This etching produces a silicon oxide mask 15. Etching in this step should be carried out in such a way that the silicon oxide film 13 does not remain in the region not covered by the photoresist mask 14. Any small part of the silicon oxide film 13 remaining unetched prevents the silicon film 12 from uniform etching with hydrazine in the subsequent step.

With the photoresist mask 14, the substrate is dipped in hydrazine hydrate (an equimolar mixture of hydrazine and water) so that the silicon film 12 is etched. (The etchant may be mixed with 0–80 mol% of isopropyl alcohol.) In this way there is formed an island-like silicon region 16, with the photoresist mask 14 dissolved by hydrazine. (FIG. 1(C))

Figure 1C:
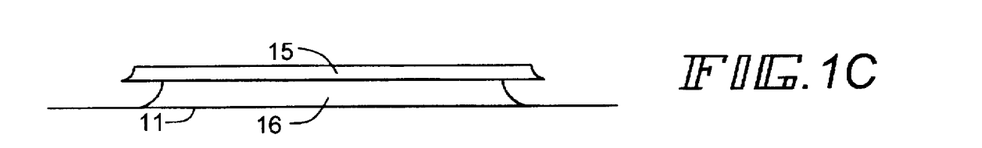

Subsequently, the silicon oxide mask 15 is etched with 1/10 BHF. This etching causes overetching to the underlying film 11. The depth of overetching in the underlying film 11 is 1.2–2 times the thickness of the silicon oxide mask 15, since the mask 15 and the underlying film 11 are formed from silicon oxide deposited by sputtering in this example.

In the next step, a silicon oxide film as the gate insulating film 17 is formed by heated CVD from monosilane ($SiH_4$) and oxygen as feed gases. The substrate is kept at 400°–600° C., say 430° C. (FIG. 1(D))

Figure 1D:
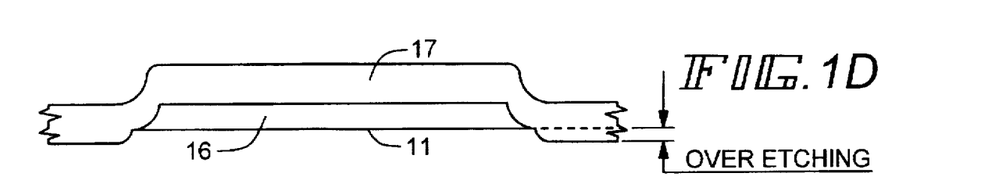

Finally, the substrate is heat-annealed at 450°–600° C., say 550° C., in an atmosphere of dinitrogen monoxide at atmospheric pressure. In this way there are formed the island-like silicon region 16 having inclined edges (which is the semiconductor active layer) and the gate insulating film 17.

Example 2

Figure 2A:
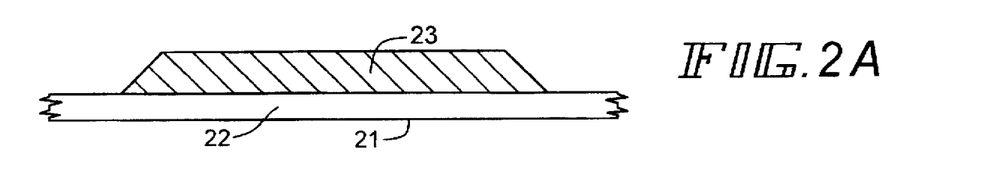
FIGS. 2(A) to 2(C) are sectional views showing the fabrication process in Example 2.
Figure 2B:
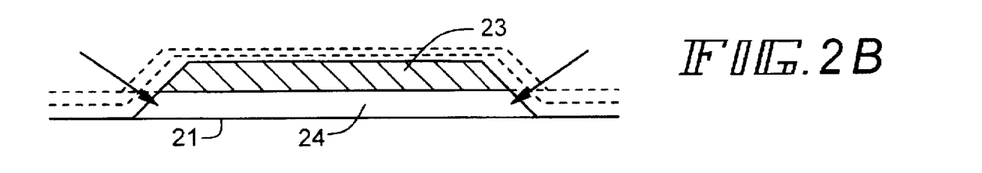
Figure 2C:
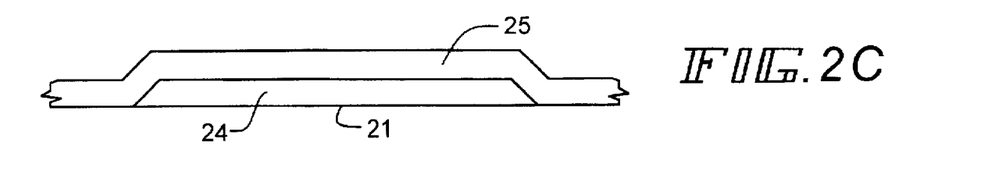

This example is illustrated in FIG. 2. A glass substrate (not shown) is coated by sputtering with an underlying film 21 (2000 Å thick) of silicon oxide. On this underlying film is deposited an amorphous silicon film 22 (100–1000 Å, say 500 Å thick) by low pressure CVD that employs disilane ($Si_2H_6$) as a feed gas. The substrate is annealed at 350°–550° C. for 5–8 hours so that excess hydrogen is released from the silicone film 22.

The silicon film 22 is irradiated with KrF excimer laser light (wavelength: 248 nm, pulse width: 20 ns) so that the silicon film 22 is crystallized. The laser light has an energy density of 250–400 mJ/cm².

The crystallized silicon film 22 is entirely coated with a photoresist, which is subsequently patterned by the known photolithography. Thus there is formed a photoresist mask 23. (FIG. 2(A))

The silicon film 22 undergoes gas etching in such a way that the substrate is placed in an evacuated quartz tube (1–100, say 6 Torr) at normal temperature, which is supplied with a mixed gas of chlorine trifluoride ($ClF_3$) and nitrogen at a flow rate of 500 sccm for each gas. The supply of chlorine trifluoride continues for 1–2 minutes, and then the system is purged by nitrogen. The etching rate is about 1000 Å per minute, which is high enough for the silicon film 22 to be etched sufficiently. Thus, there is obtained an island-like silicon region 24. The end point of etching can be judged by observing the clarity of the substrate (which changes as etching proceeds) using an optical sensor.

Etching in this example gives rise to an ideally inclined edge, the angle of inclination being 30°–60°. This is due to the fact that the silicon film 22 and the photoresist mask 23 are etched at almost the same rate and hence the edges of the photoresist mask 23 and the silicon film 22 retreat at almost the same rate as indicated by broken lines and arrows, as shown in FIG. 2(B).

The island-like silicon region in Example 1 (FIG. 1) has inclined edges, but the angle of inclination is steep at the upper part of the silicon film. By contrast, this example gives rise to edges inclined throughout at an angle of 30°–60°. (FIG. 2(B))

Subsequently, the resist mask 23 is removed, and finally a silicon oxide film 25 (1000–1500 Å, say 1200 Å0 thick) is formed by heated CVD in the same manner as in Example 1. (FIG. 2(C))

In this example, the photoresist mask is used as such and hence, unlike Example 1, this example poses no problem with step coverage. This is because chlorine trifluoride greatly varies in selectivity for silicon and underlying silicon oxide.

Example 3

This example is illustrated in FIG. 3. A glass substrate (not shown) is coated by sputtering with an underlying film 31 (2000 Å thick) of silicon oxide. On this underlying film is deposited an amorphous silicon film 32 (500 Å thick) by low pressure CVD that employs disilane as a feed gas. The substrate is annealed at 550° C. for 1 hour in an atmosphere of oxygen so that an extremely thin protective film 33 of silicon oxide is formed on the silicon film 32. An aqueous solution (1–100 ppm) of nickel acetate is applied by spin coating.

Nickel functions as a catalyst to promote the crystallization of amorphous silicon. Nickel incorporated into the silicon film 32 in concentrations higher than $1 \times 10^{17}$ atoms/cm³ lowers the crystallization temperature and reduces the crystallization time. Other elements that function as a catalyst include cobalt (Co), iron (Fe), platinum (Pt), and palladium (Pd). In this example, the silicon film 32 is crystallized by annealing at 550° C. for 5–8 hours. After crystallization, a photoresist mask 34 is formed by the known photolithography. (FIG. 3(A))

The protective film 33 of silicon oxide is etched with 1/10 BHF through the photoresist mask 34. Thus, there is formed an extremely thin film 35 of silicon oxide. (FIG. 3(B))

With the photoresist mask 34, the substrate is placed in an evacuated quartz tube (3.5 Torr) at normal temperature, which is supplied with a mixed gas of chlorine trifluoride ($ClF_3$) and nitrogen at a respective flow rate of 300 sccm and 900 sccm. The supply of feed gas continues for 2–5 minutes, and then the supply of chlorine trifluoride is stopped. Thus there is formed an island-like silicon region 36. (FIG. 3(C))

Figure 3A:
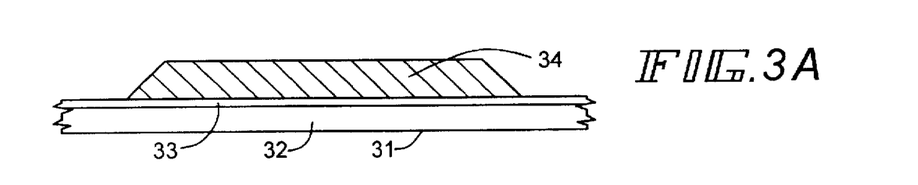
FIGS. 3(A) to 3(D) are sectional views showing the fabrication process in Example 3.
Figure 3B:
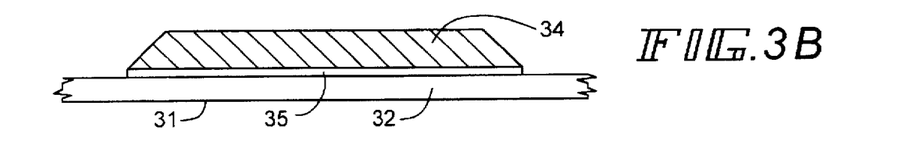
Figure 3C:
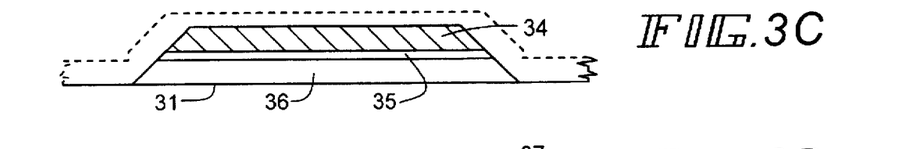
Figure 3D:
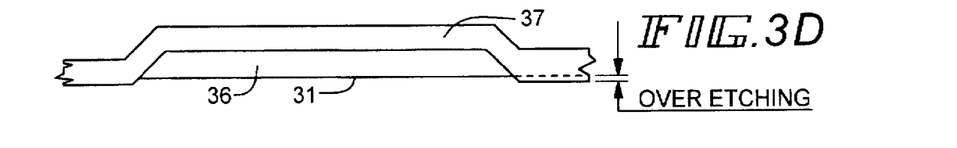

The mask 35 of silicon oxide lying between the photoresist mask 34 and the silicon film 32 is so thin that it does not function as a mask as in the case of Example 1 (FIG. 1), but it is etched (as indicated by broken lines) as the etching of the silicon film 32 and the photoresist mask 34 proceeds. Thus there is formed an island-like silicon region 36 having ideally inclined edges.

Subsequently, the resist mask 34 is removed and the silicon oxide masking film 35 is etched with 1/10 BHF. The masking film 35 in this example is so thin (30–60 Å) that the underlying film 31 undergoes much less overetching than the underlying film 11 in Example 1.

Finally, a silicon oxide film 37 (1200 Å thick) is formed by heated CVD in the same manner as in Example 2. The silicon oxide film 37 functions as the gate insulating film. (FIG. 3(D))

Example 4

FIG. 5 shows a sectional view of the process of forming an island-like silicon region according to the present invention and then fabricating it into a TFT to be used as a switching transistor for the active matrix circuit. First, a glass substrate (Corning #7059) 501 is coated by sputtering with an underlying film 502 (2000 Å thick) of silicon oxide. On this underlying film is deposited by plasma CVD an amorphous silicon film 503 (300–1500 Å, say 1000 Å thick). Then, a silicon oxide film 504 (200 Å thick) is formed by sputtering.

Figure 5A:
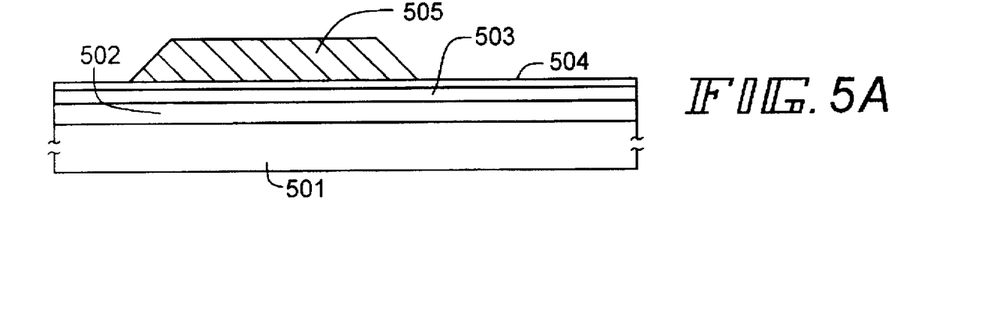
FIGS. 5(A) to 5(E) are sectional views showing the fabrication process of TFT in Example 4.
Figure 5B:
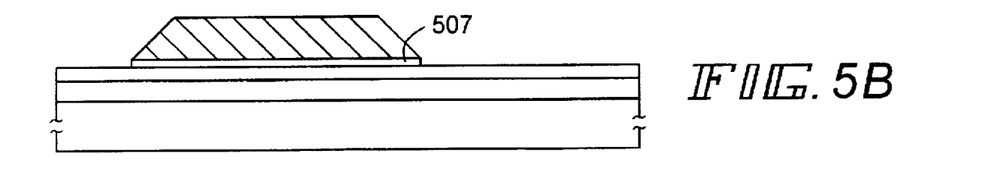

The silicon film 503 is crystallized by annealing at 600° C. for 48 hours in a reducing atmosphere. (Annealing for crystallization may be replaced by irradiation with high-intensity light such as laser light.)

The entire surface is coated with a photoresist by the known photolithography. By patterning the photoresist, there is formed a photoresist mask 505. (FIG. 5(A))

With this photoresist mask 505, the silicon oxide film 504 undergoes etching with 1/10 BHF. Thus there is formed a protective film 507 of silicon oxide. (FIG. 5(B))

With the photoresist mask 505, the silicon film 503 is etched with a pyrocatechol solution of ethylene diamine to form an island-like silicon region 506 having inclined edges. This etching attacks only a part of the photoresist mask 505. After etching is completed, the remaining photoresist mask 505 is removed completely. (FIG. 5(C))

Figure 5C:
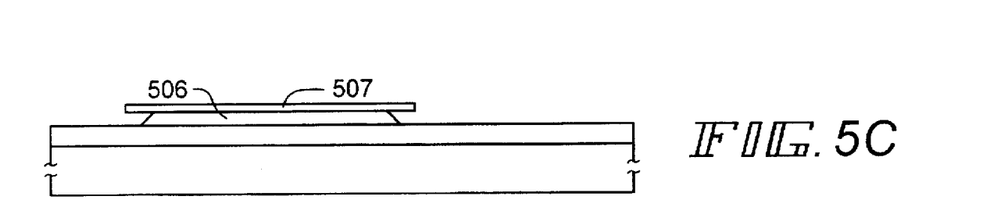

The silicon oxide protective film 507 undergoes etching with 1/10 BHF. (in this example, both the underlying film 502 and the protective film 507 are formed from silicon oxide by sputtering.) These silicon films are etched by 1/10 BHF (at 23° C.) at a rate of 900–1000 Å per minute. Therefore, when the silicon film 503 is etched, the etching depth of the underlying film 502 is 250–350 Å which is approximately equal to the thickness of the protective film 507, even in the case where overetching is taken into account.

Figure 5D:
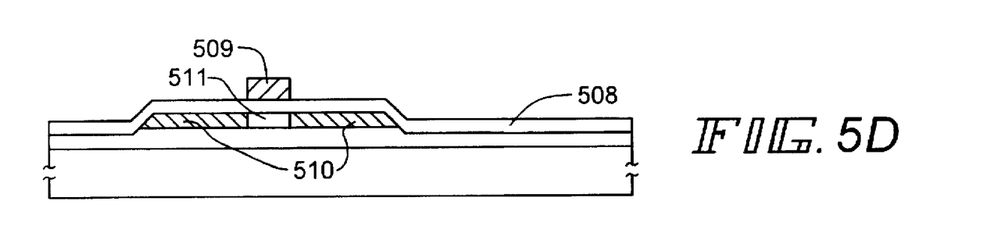

A silicon oxide film 508 (1000–1500 Å, say 1200 Å thick) is formed at 400°–600® C. (say 480° C.) by heated CVD that employs monosilane (SiH$_4$) and oxygen as feed gases. The thus formed silicon oxide film 508 is used as the gate insulating film.

A polycrystalline silicon film (doped with phosphorus to increase its conductivity) is formed by reduced pressure CVD. By etching this polycrystalline silicon film, there is formed the gate electrode 509. Using this gate electrode 509 as a mask for the self-alignment technique, an n-type impurity (phosphorus) is introduced by ion doping into the island-type silicon region 506. Thus, there are formed n-type impurity regions 510. The substantially intrinsic region 511 held between the n-type impurity regions 510 becomes the channel-forming region of TFT afterward. The n-type impurity regions 510 are activated by annealing at 450°–550° C. (FIG. 5(D))

Figure 5E:
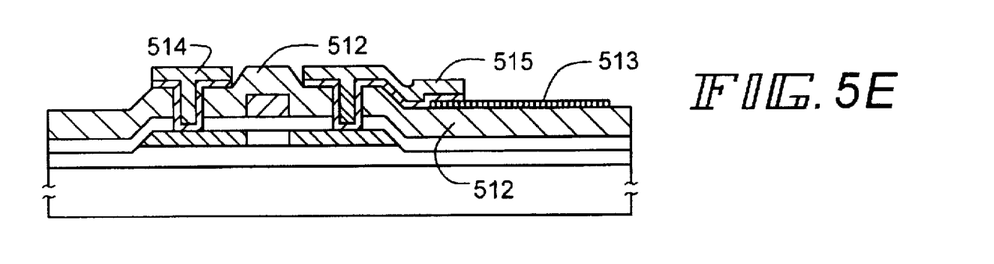

An interlayer insulator 512 (4000Å thick) (which is a multilayer film composed of a 500 Å thick silicon nitride layer and a 4000Å thick silicon oxide layer) is formed by plasma CVD. On the interlayer insulator 512 is selectively formed a transparent conductive film (500 Å thick). It functions as the picture element electrode 513.

In the interlayer insulator 512 are formed contact holes. In the contact holes are consecutively deposited by sputtering a 500 Å thick titanium film and a 4000Å thick aluminum film. By etching these films, there are formed the source/drain electrodes 514, 515 of TFT. In this way, there is formed the active matrix circuit. (FIG. 5(E))

Example 5

FIG. 6 shows a sectional view of the process of forming an island-like silicon region according to the present invention. First, a glass substrate 601 is consecutively coated with an underlying film 602 (2000 Å thick) of silicon oxide and an amorphous silicon film 603 (300–1000 Å, say 500 Å thick) which are deposited in the same manner as in Example 4. The coated substrate is heat-treated at 500°–600° C. (say 550° C.) for 1 hour in an atmosphere of oxygen, so that an extremely thin protective film of silicon oxide is formed (not shown).

Figure 6A:
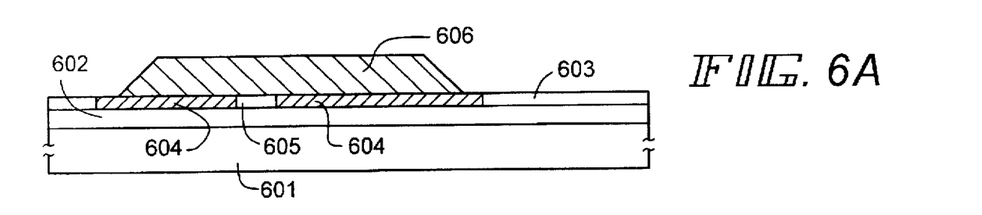
FIGS. 6(A) to 6(E) are sectional views showing the fabrication process of TFT in Example 5.

The silicon film 603 is selectively doped with phosphorus so as to form n-type impurity regions 604. The substantially intrinsic region 605 held between the n-type impurity regions 604 becomes the channel-forming region of TFT afterward.

Subsequently, an aqueous solution (1–100 ppm) of nickel acetate is applied by spin coating so that an extremely thin film of nickel acetate is formed on the amorphous silicon film 603. Heat-annealing is performed at 500°–580° C. (say 550° C.) for 2–12 hours (say 4 hours), so that nickel diffuses into the amorphous silicon film 603 to crystallize it. The heat-annealing for crystallization also activates the previously doped n-type impurity.

A photoresist mask 606 is formed by the known photolithography and patterning. (FIG. 6(A))

Figure 6B:
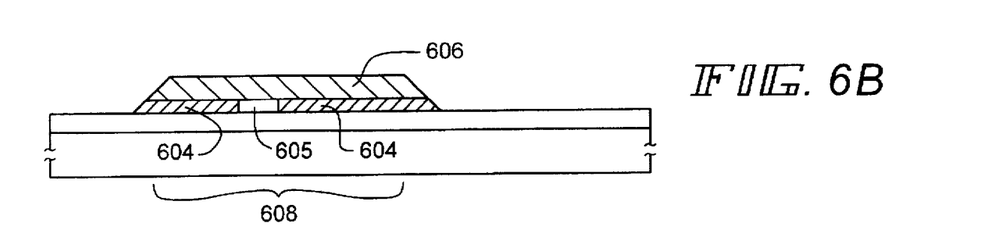
Figure 6C:
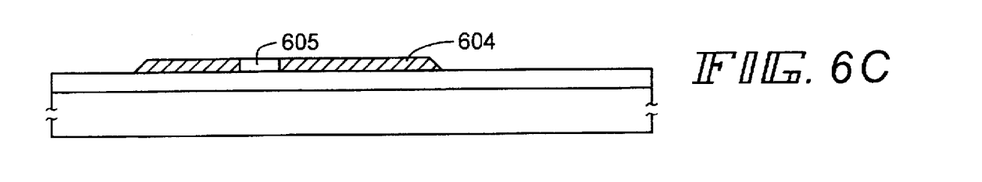

With this photoresist mask 606 on, etching with 1/10 BHF is performed on the silicon oxide (not shown) formed previously by thermal oxidation, so that the surface of the silicon film 603 is exposed.

The silicon film 603 undergoes gas etching in such a way that the substrate is placed in an evacuated quartz tube (6 Torr) at normal temperature, which is supplied with a mixed gas of chlorine trifluoride (ClF$_3$) and nitrogen at a flow rate of 500 sccm for each gas. As the result of this etching, there is formed an island-like silicon region 608 having inclined edges as in the case of Example 3. In this step only a part of the photoresist mask 606 is etched. (FIG. 6(B))

The remaining photoresist mask 606 is removed, and the surface of the island-like silicon region 608 is cleaned with 1/10 BHF. (FIG. 6(C))

Figure 6D:
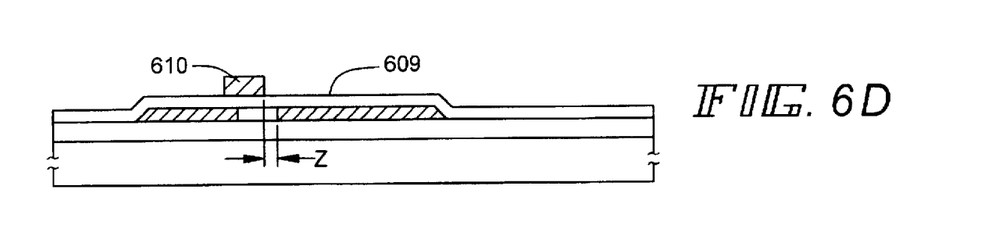

A silicon oxide film 609 (1000–1500 Å, say 1200 Å thick) is formed by heated CVD from monosilane (SiH$_4$) and oxygen as feed gases. The thus formed silicon oxide film is used as the gate insulating film.

An aluminum film (3000–6000 Å, say 3000 Å thick) is formed by sputtering. By etching this aluminum film the gate electrode 610 is formed. This aluminum film is incorporated with a trace amount of silicon, scandium (Sc), or zirconium (Zr) for improvement in heat resistance. As shown in FIG. 6(D), the gate electrode 610 is formed such that it partly overlaps with the n-type impurity region 604 (which becomes the source region), and it is a distance z away from the n-type impurity region 606 (which becomes the drain region). This arrangement is intended to reduce the off-state current. Short-circuiting with the upper interconnect can be effectively prevented by coating the top and side of the gate electrode 610 with an anodized substance. /FIG. 6(D))

Figure 6E:
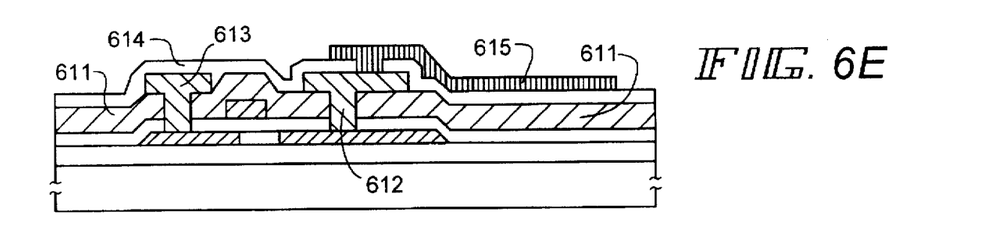

A first interlayer insulator 611 is formed by plasma CVD. It is a dual layer composed of a 500 Å thick silicon nitride film and a 4000Å thick silicon nitride film. In the interlayer insulator 611 are formed contact holes. In the contact holes is deposited by sputtering a 4500 Å thick aluminum film. By etching this film, there are formed the source/drain electrodes 612, 613.

A second interlayer insulator 614 which is a 2000 Å thick silicon oxide film) is formed by plasma CVD. In the interlayer insulator 614 is formed a contact hole. In the contact hole is deposited by sputtering a 500 Å thick transparent conductive film of indium oxide. By etching this film, there is formed a picture element electrode 615. In this way, there is formed the switching transistor for the active matrix circuit and the picture element electrode involved therein. (FIG. 6(E))

Although the foregoing examples demonstrate the process for fabricating n-channel type TFT's, it goes without saying that the same procedure as mentioned therein can be applied to p-channel type TFT's and complementary transistors which have both the n-channel type and p-channel type on the same substrate. The present invention may be applied to not only TFT's of simple structure as shown in the foregoing examples but also TFT's having the source/drain of silicide as disclosed in Japanese Patent Laid-open No. 124962/1994.

Although explanation in the foregoing examples is focused on TFT's, it goes without saying that the present invention can be applied to other circuit elements, such as thin-film integrated circuits having a plurality of electrodes in one island-like semiconductor region, stacked-gate type TFT's, diodes, resistors, and capacitors.

As mentioned above, according to the present invention, it is possible to form an island-like silicon (semiconductor) region having ideally inclined edges. This improves the yields and reliability of thin-film semiconductor devices with maximum performance.

The thin-film semiconductor device fabricated according to the present invention is suitable for use as the transistor to control picture elements in the active matrix circuit for liquid crystal display because it has a low leakage current between the source and drain. Therefore, the present invention is of great industrial use.

What is claimed is:

1. A process for fabricating a thin-film semiconductor device comprising the steps of:
   selectively forming a mask on a silicon film formed on an insulating surface, said silicon film having a thickness of approximately 100–1000 Å; and
   etching the silicon film using the mask by the aid of a liquid or unionized gas capable of etching silicon to form an island-like thin-film silicon semiconductor region that has no plasma induced damage,
   wherein said thin-film silicon semiconductor region includes at least source, drain and channel regions of said semiconductor device.

2. The process of claim 1 wherein the island-like silicon region has tapered edges.

3. The process of claim 1 wherein the mask is a photoresist film.

4. The process of claim 1 wherein the mask comprises a material selected from the group consisting of silicon oxide film, silicon nitride film, and silicon oxide nitrogen film.

5. The process of claim 1 wherein the liquid capable of etching silicon is one which has the $NH_2$ group.

6. The process of claim 1 wherein the liquid capable of etching silicon is one which contains hydrazine.

7. The process of claim 1 wherein the liquid capable of etching silicon is one which contains ethylenediamine.

8. The process of claim 1 wherein the gas capable of etching silicon is one which contains chlorine fluoride.

9. The process of claim 1 further comprising the step of forming a gate insulating film on the etched silicon film to a thickness two to ten times larger than that of the silicon film.

10. A process for fabricating a thin-film semiconductor device comprising the steps of:
    etching a silicon film formed on an insulating surface by the aid of a liquid or unionized gas to form an island-like thin-film silicon semiconductor region that has no plasma induced damage; and
    forming a gate insulating film covering said silicon semiconductor region by plasma-free chemical vapor deposition
    wherein said silicon semiconductor region includes at least source, drain and channel regions of said semiconductor device.

11. The process of claim 10 wherein the island-like silicon region has tapered edges.

12. The process of claim 10 wherein the liquid capable of etching silicon is one which has the $NH_2$ group.

13. The process of claim 10 wherein the liquid capable of etching silicon is one which contains hydrazine.

14. The process of claim 10 wherein the liquid capable of etching silicon is one which contains ethylenediamine.

15. The process of claim 10 wherein the gas capable of etching silicon is one which contains chlorine fluoride.

16. The process of claim 10 wherein the gate insulating film is formed by heated CVD which employs silane and oxygen or nitrogen oxide as feed gases.

17. The process of claim 10 further comprising a step of annealing the gate insulating film at 450°–600° C. in an atmosphere of dinitrogen monoxide after the formation of the gate insulating film.

18. The process of claim 10 wherein the gate insulating film is two to ten times as thick as the silicon film.

19. The process of claim 10 wherein the silicon film has a thickness of 100–1000 Å.

20. A process for fabricating a thin-film semiconductor device comprising the steps of:
    forming a semiconductor film having crystalline silicon on an insulating surface;
    disposing a mask pattern on said semiconductor film;
    patterning said semiconductor film by etching in accordance with said mask pattern to form at least one semiconductor island that has no plasma induced damage;
    forming source and drain regions within said semiconductor island with a channel region defined therebetween,
    wherein said etching is performed with a liquid etchant having an $NH_2$ group.

21. The process of claim 20 wherein said etchant is hydrazine.

22. The process of claim 20 wherein said etchant is ethylenediamine.

23. The process of claim 20 wherein said mask pattern comprises a material selected from the group consisting of silicon oxide film, silicon nitride film, and silicon oxide nitrogen film.

24. A process for fabricating a thin-film semiconductor device comprising the steps of:

forming a semiconductor film having crystalline silicon on an insulating surface;

disposing a mask pattern on said semiconductor film;

patterning said semiconductor film by etching in accordance with said mask pattern to form at least one semiconductor island that has no plasma induced damage;

forming source and drain regions within said semiconductor island with a channel region defined therebetween, wherein said etching is performed with a gaseous etchant having chlorine fluoride in a non-plasma state.

25. The process of claim 24 wherein said mask pattern comprises a photoresist.

26. The process of claim 24 wherein said chlorine fluoride is selected from the group consisting of $ClF$, $ClF_3$, and $ClF_5$.

27. The process of claim 24 wherein said chlorine fluoride is $ClF_3$.

* * * * *